(12) United States Patent
Rehm et al.

(10) Patent No.: US 6,437,252 B2
(45) Date of Patent: Aug. 20, 2002

(54) METHOD AND STRUCTURE FOR REDUCING POWER NOISE

(75) Inventors: Simone Rehm, Ehningen; Roland Frech, Ostfildern; Erich Klink, Schoenaich; Helmut Virag, Calw; Thomas-Michael Winkel, Schoenaich, all of (DE); Wiren Becker, Hyde Park, NY (US); Bruce Chamberlin, Kirkwood, NY (US); Wai Ma, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/741,455

(22) Filed: Dec. 19, 2000

(30) Foreign Application Priority Data

Dec. 21, 1999 (EP) .............................. 99125462

(51) Int. Cl.⁷ ................................. H05K 1/02
(52) U.S. Cl. ................. 174/255; 174/260; 29/832; 361/734; 361/767
(58) Field of Search ................. 174/260, 261, 174/255; 361/736, 803, 763, 794, 734, 767; 439/493; 257/724; 29/832

(56) References Cited

U.S. PATENT DOCUMENTS

| | | | | |
|---|---|---|---|---|
| 5,949,657 A | * | 9/1999 | Karabatsos | 361/803 |
| 6,043,987 A | * | 3/2000 | Goodwin et al. | 361/763 |
| 6,198,362 B1 | * | 3/2001 | Harada et al. | 361/794 |
| 6,330,164 B1 | * | 12/2001 | Khandros et al. | |

* cited by examiner

*Primary Examiner*—Albert W. Paladini
(74) *Attorney, Agent, or Firm*—Lynn L. Augspurger, Esq.; Kevin P. Radigan, Esq.; Heslin Rothenberg Farley & Mesiti P.C.

(57) ABSTRACT

Described is a method for minimizing switching noise in the high- and mid-frequency range on printed circuit cards or boards by means of a plurality of surface mounted decoupling capacitors. A novel configuration and implementation of capacitor pads including the connecting vias is also presented. As a result the parasitic inductance of the pads and vias can be significantly reduced. Thus the effectiveness of the decoupling capacitors in the mid and high frequency range can be increased, the voltage drop can be reduced and the system performance can be increased. Several design rules for the new pad via configuration lead to the significant reduction of the parasitic inductance. The proposal is especially important for high integrated system designs on boards and cards combined with increased cycle times.

18 Claims, 7 Drawing Sheets

METHOD AND STRUCTURE FOR REDUCING POWER NOISE

PRIOR FOREIGN APPLICATION

This application claims priority from European patent application No. 99125462.4, filed Dec. 21, 1999, which is hereby incorporated herein by reference in its entirety.

TECHNICAL FIELD

The present invention relates in general to the reduction of power noise. In particular, it relates to such a reduction in the mid- and high-frequency range. Still more specifically, the invention relates to a pad-via configuration for SMT decoupling capacitors.

BACKGROUND ART

Due to the growing complexity of semiconductor devices the total amount of switching current needed by the logic devices increases. As a result the simultaneous switching noise increases also and results in a slower working logic, in a slower cycle time and thus in a decreasing system performance. In order to yield a higher system performance one goal of modern system designs is to stabilize the voltage. It is known that a stabilized voltage can be obtained with the help of decoupling capacitors mounted on MCMs, cards and boards. However, the higher power noise combined with a lower operating voltage of the semiconductor devices results in a growing number of capacitors needed for decoupling purposes. This results in additional problems:

- large areas on MCM, cards and/or boards needed for capacitor placement and with a growing distance of the capacitor to the noise source the effectiveness of the capacitor is decreased
- reduced placement area for capacitors, due to a higher component integration factor on cards/boards
- growing costs for assembled components, due to a higher number of components and increase of manufacturing time (drilling of via holes, component placement, edging, etc.)
- wiring problems on cards/boards, due to an increased number of power/ground vias as well as a possibly increased signal delay, decreased cycle time, increased number of card/board layers and decreased system performance
- decreased effective copper on power and ground layers, due to an increased number of via and clearence holes; increased DC resistance of power and ground planes; increased DC voltage drop on card/board between voltage source and logic; decreased system performance.

In order to make all the capacitors as effective as possible the charge of the capacitors must be provided as fast as possible to the noise source. Therefore the internal inductance of the capacitor as well as the path inductance (capacitor to noise source) must be kept as small as possible. Due to these restrictions the capacitor must

- be placed as close as possible to the noise source;
- have a small internal inductance; and
- have a small inductance of the capacitor pad and the via connecting the pad to the voltage and ground plane.

Decoupling capacitors are used to provide a short term current source or sink for the circuitry in an effort to provide a stable power supply. For example, the decoupling capacitors act as a storage device for electrical charge which can provide a short term current source for the circuitry.

It is well known in the art that capacitors with a low capacitance value may be used as a high frequency noise filter, and capacitors with a high capacity value may be used as a low frequency noise filter.

Typically, decoupling capacitors are placed as close as possible to the circuitry so as to increase their effectiveness. Thus, U.S. Pat No. 4,654,694 discloses side connections to place a capacitor in close proximity to a chip or, alternatively, to a chip and GND/Power I/O. By this technique, the effective inductance of the power paths is minimized.

In some instances, decoupling capacitors have been placed within the package containing the integrated circuit. Thus, U.S. Pat. No. 4,945,399 describes a semiconductor chip carrier including a plurality of distributed high frequency decoupling capacitors as an integral part of the carrier. The distributed capacitors are formed as a part of the first and second layers of metallurgy and separated by a layer of thin film dielectric material.

U.S. Pat. No. 5,132,613 discloses an integrated circuit test structure including individual layers of a personalization substrate and decoupling capacitors, whereby said decoupling capacitors are electrically coupled to the metal lines in close proximity, the personalization substrate thereby minimizing the associated lead inductance and thus maximizing the effectiveness of the decoupling capacitors.

Although there are some advantages in using capacitors with a low internal inductance, a great disadvantage is the also low capacitance of the capacitor itself (low inductance is only available with low capacitance). One further disadvantage is the decreased effectiveness of the low inductive capacitor that is limited by the inductance of the mounting pads together with the vias of the capacitor.

SUMMARY OF THE INVENTION

It is therefore an object of the present invention to provide a method for minimizing switching noise in the high- and mid-frequency range on printed circuit cards or boards by means of several surface mount decoupling capacitors, whereby the parasitic inductance of the pads and vias is minimized.

It is a further object of the present invention to increase the effectiveness of the decoupling capacitors, to reduce the voltage drop and to increase the overall system performance.

These and other objects and advantages are achieved by a method for minimizing switching noise in the high- and mid-frequency range according to aspects of the present invention.

Advantageous embodiments of the method according to the invention are laid down in the claims.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1:
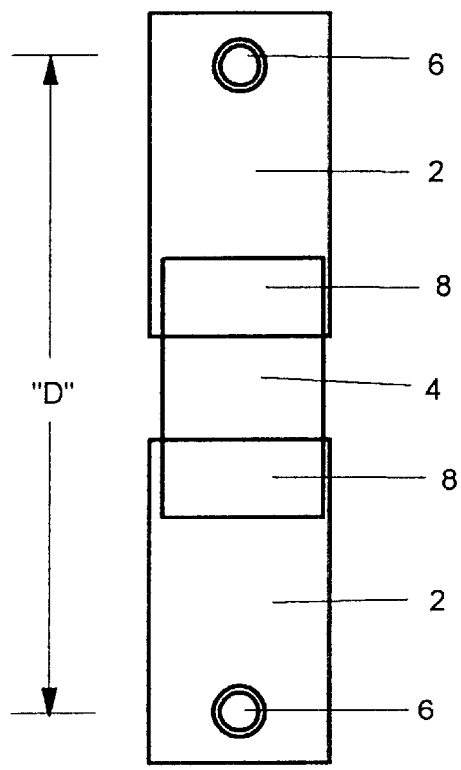
FIG. 1 shows the common pad and via design according to the state of the art.
Figure 2:
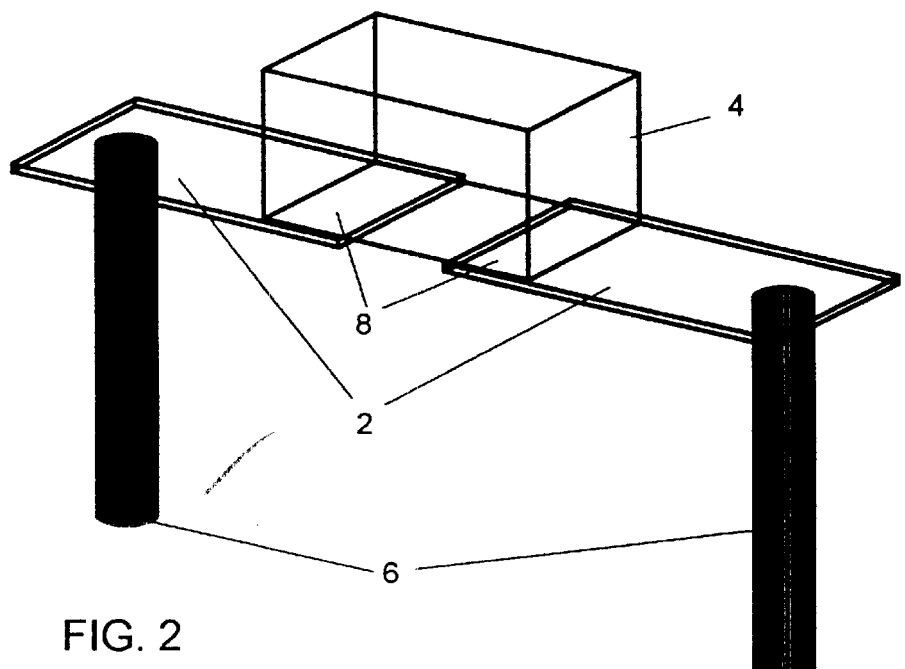
FIG. 2 depicts the design according to FIG. 1 in a three-dimensional view.

In FIG. 1 the common pad and via design (as normally recommended by the capacitor vendor) is shown as a top view drawing in combination with one mounted capacitor. FIG. 2 shows the same pad and via configuration with the mounted capacitor in a three-dimensional view. The size of the pad 2 itself is mainly driven by the size of the capacitor body 4 and by manufacturing especially soldering recommendations. As recommended the vias 6 are placed outside the soldering area 8 of the pad. As shown in FIGS. 1 and 2 the center to center distance "D" of the vias is large. Each pad 2 of the capacitor 4 is connected with a via 6 to power and ground respectively (not shown).

Figure 3:
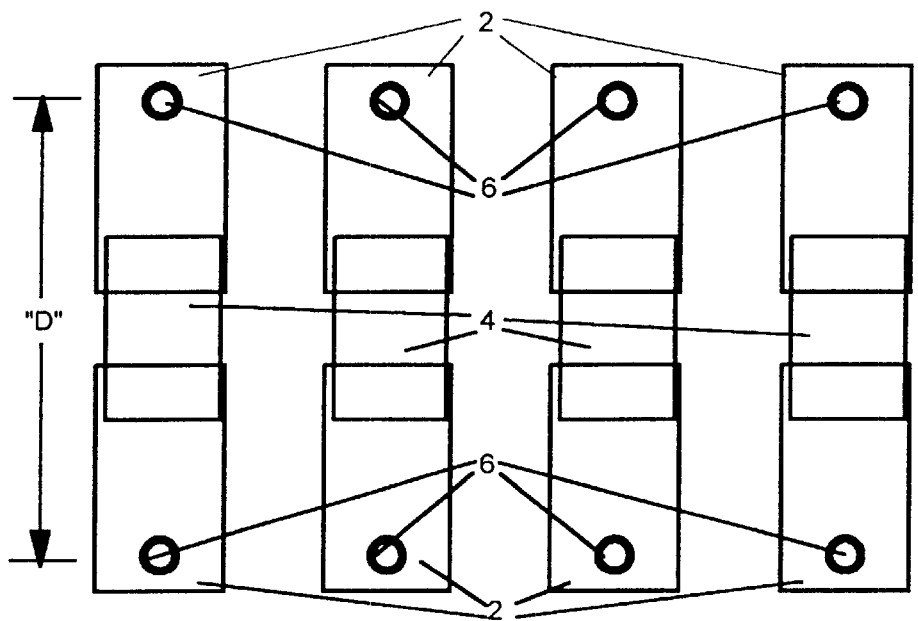
FIG. 3 is a two-dimensional view of multiple capacitor pads with vias and mounted capacitors according to the state of the art.
Figure 4:
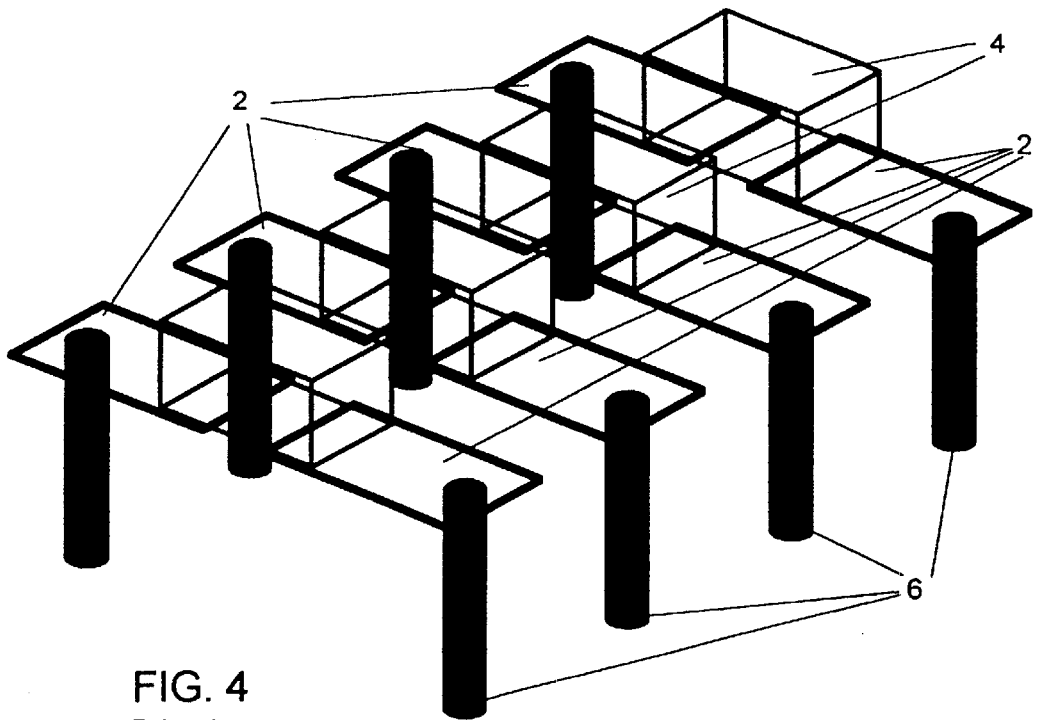
FIG. 4 shows the arrangement of FIG. 3 in a three-dimensional view.

In order to be able to use multiple surface mount capacitors the capacitors are mounted side by side on pads with a safety distance which is specified by automatic placement restrictions. FIG. 3 shows a two-dimensional and FIG. 4 a three-dimensional drawing of multiple capacitor pads 2 with vias 6 and mounted capacitors 4.

Figure 5:
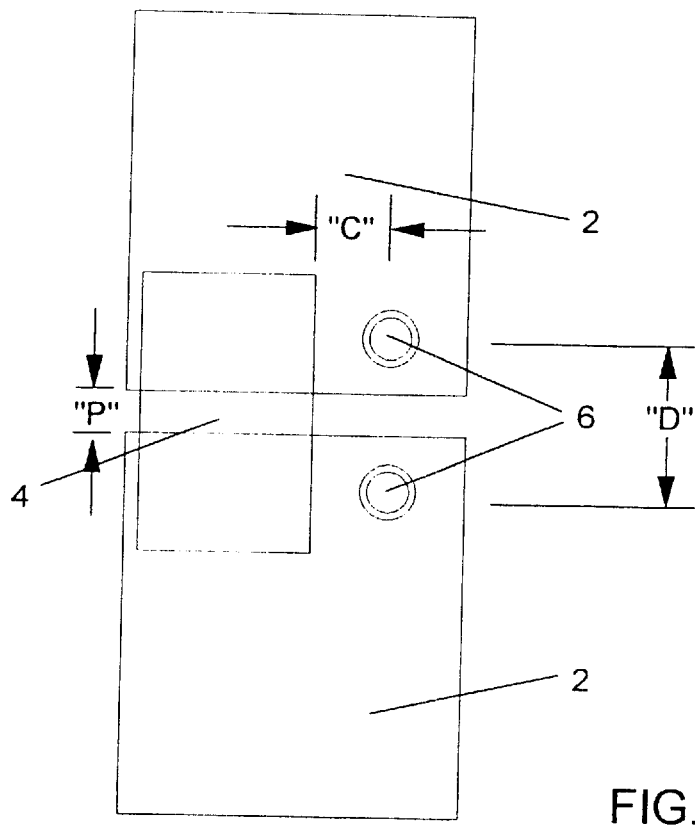
FIG. 5 is a two-dimensional view of the capacitor pad and via configuration according to the invention.
Figure 6:
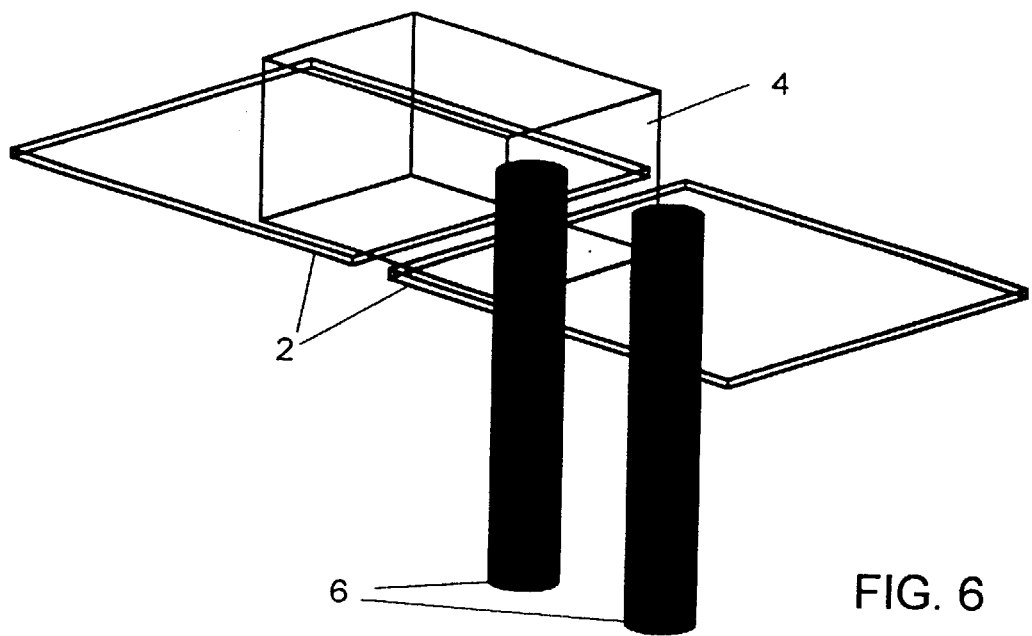
FIG. 6 depicts the configuration of FIG. 5 in a three-dimensional view.

The new capacitor pad and via configuration according to the invention is shown in FIGS. 5 and 6, respectively. The main differences between the old pad via configuration as shown in FIGS. 1 and 2 are the pad size, the distance between both pads and the via location and thus also the center to center distance "D" of the vias 6. As compared to the state of the art, the pads are now enlarged in, the vias thereby being arranged in close proximity to the respective capacitors. In order to minimize the loop inductance of the pads and vias the pad via configuration has to meet the following requirements:

minimum center to center distance "D" of the vias 6

The reason is that the smaller the distance the higher the mutual coupling between the vias and the lower the loop inductance minimum distance "P" between both capacitor pads 2

The reason is that the smaller the distance between the pads the smaller the distance of the vias minimum distance "C" between the vias 6 and the contact point between the capacitor 4 and the pad 2

The reason is that the smaller the distance the smaller the loop inductance.

A further reduction of the loop inductance of the pad via configuration as shown in FIGS. 5 and 6 can be achieved by:

1. enlarging the width of the pad 2 and adding a second via pair on the left side of the capacitor (cf. FIGS. 5 and 6), so that a structure results wherein vias and capacitors are arranged alternatingly;

Thus, by paralleling the vias, the inductance L is decreased.

2. using multiple vias on one pad in a row;

Here, paralleling the vias leads to a decrease in required floor space compared to 1.

3. using a larger via diameter;

4. using a larger pad size;

Points 3 and 4 result in a decreased inductance L.

5. placing the vias under the capacitor body;

This, as well as point 2, results in a decrease in required floor space and the minimum space leads to a minimum inductance.

Figure 7:
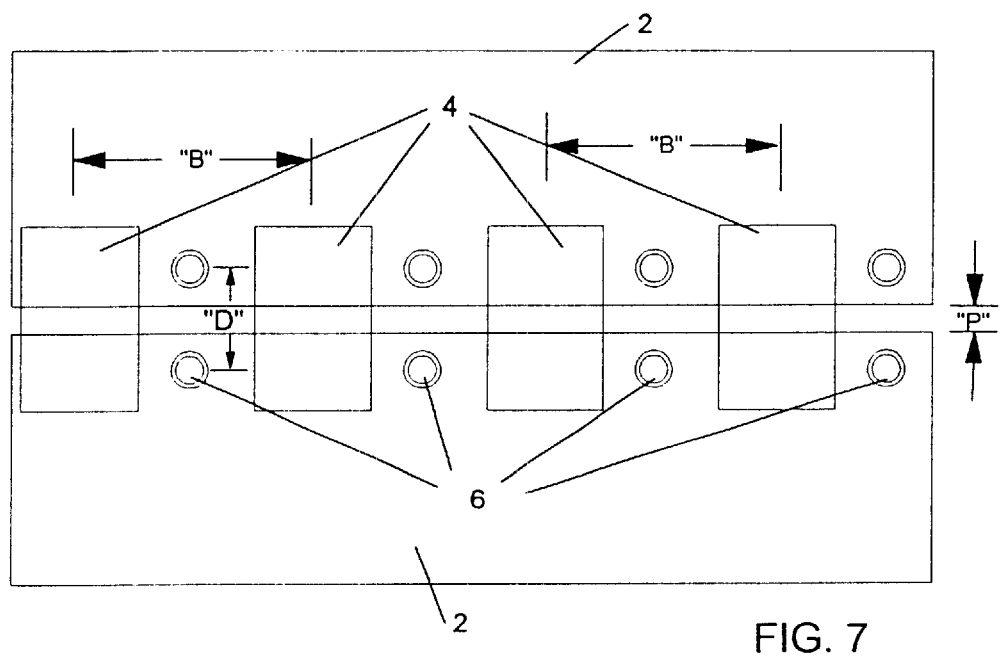
FIGS. 7 and 8 show another configuration according to the invention, providing multiple decoupling capacitors.
Figure 8:
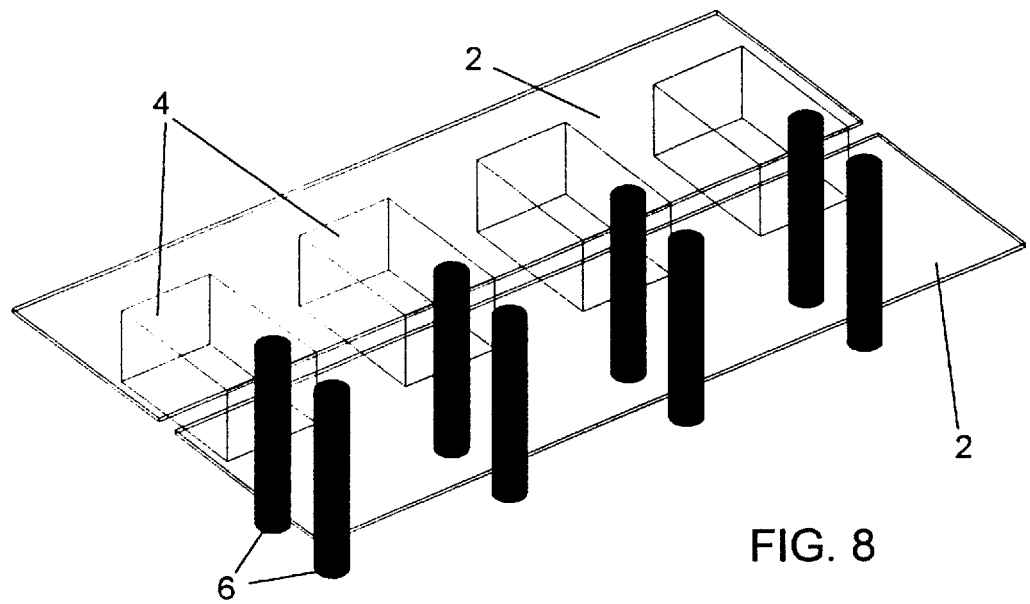

In order to use multiple surface mount capacitors for decoupling purposes of one voltage the capacitors can be mounted on capacitor pad lines as shown in FIGS. 7 and 8. The distances "B" between the capacitor bodies remain the same as in FIG. 2, being determined mainly by the assembly tool used. The vias 6 are placed in the area between the capacitors 4 with a minimum center to center distance "D" of a via pair. The distance "P" between the pad lines is also reduced to a minimum.

Figure 9:
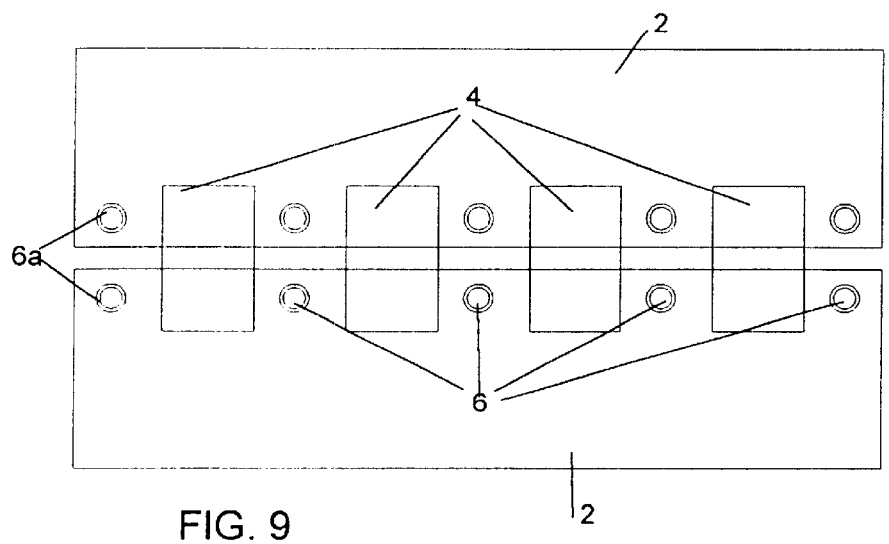
FIGS. 9 and 10 show still another configuration according to the invention.
Figure 10:
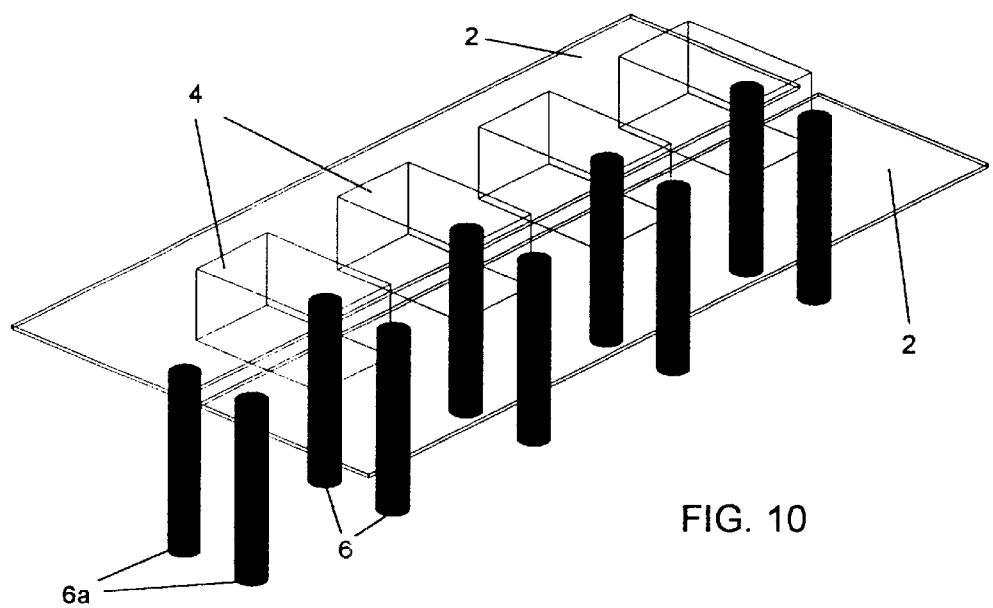

A further improvement of this structure is shown in FIGS. 9 and 10 where the width of the pad 2 line is enlarged and an additional via pair 6a is added at the outer ends of the pad line 2. In order to avoid shorts between the pads caused by capacitors which are placed incorrectly, the pad line distance under the capacitor can be enlarged.

Figure 11:
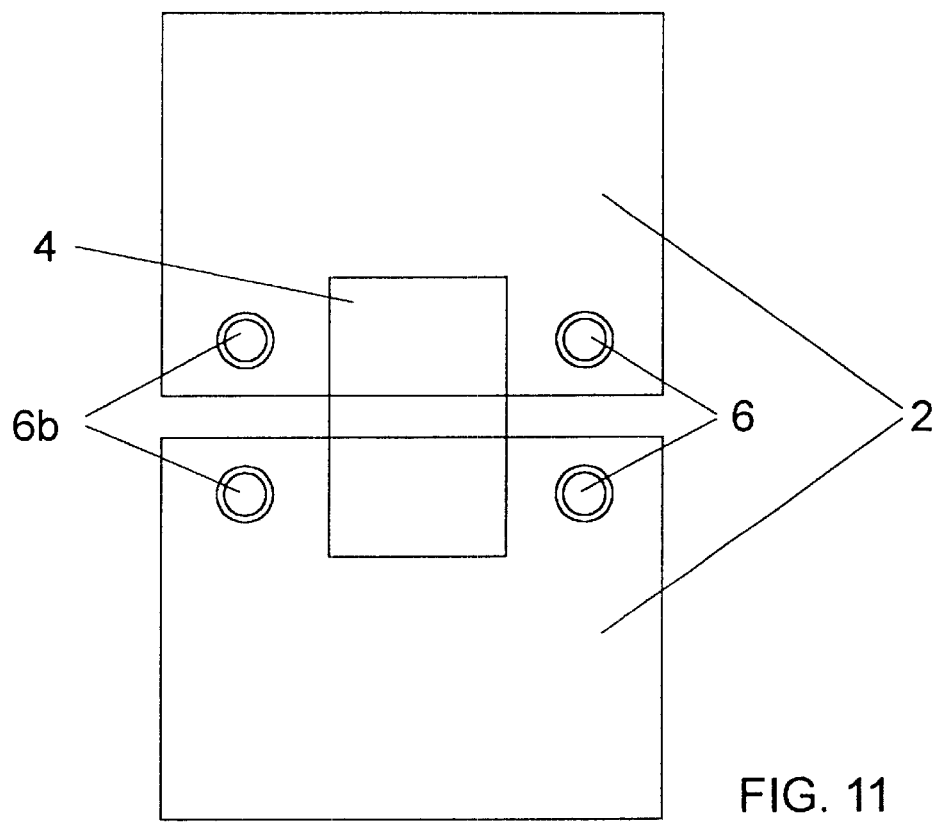
FIGS. 11 and 12 show yet another configuration according to invention.
Figure 12:
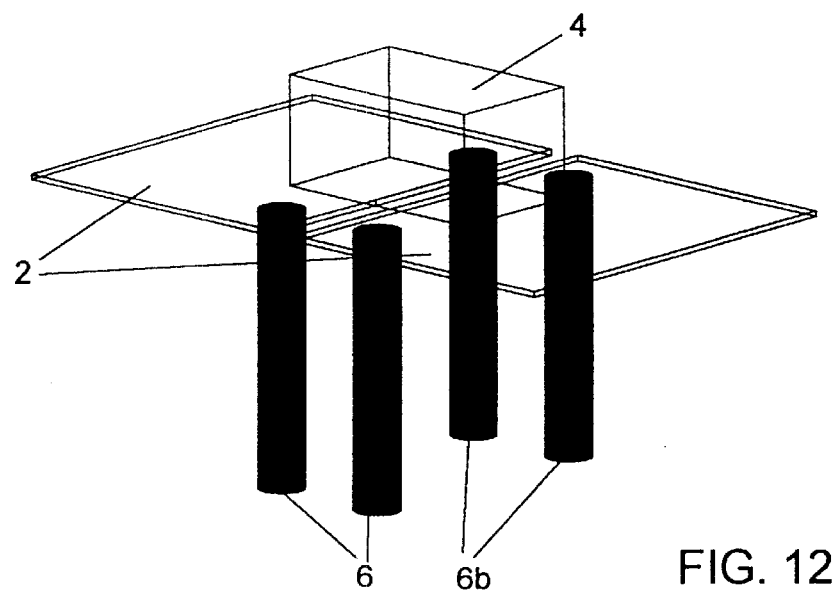

A further improvement can be achieved if the pads 2 of FIG. 5 are enlarged so that an additional via pair 6b can be placed on the outer side of capacitor 4. This embodiment is shown in FIGS. 11 and 12.

Figure 13:
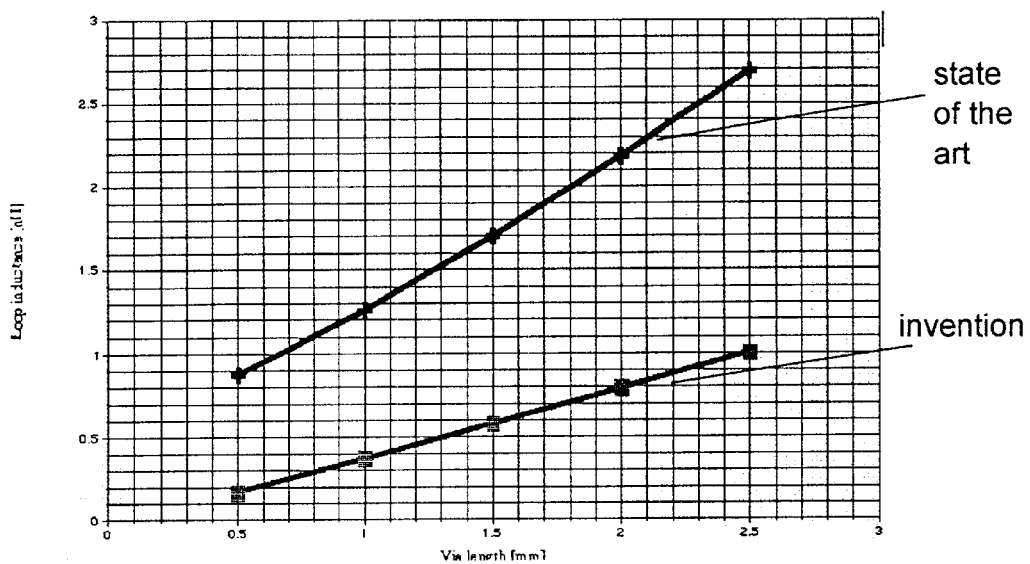
FIG. 13 is a graph showing a comparison of the simulated loop inductance for a group of three capacitors using state of the art configuration and the configuration according to the invention.

FIG. 13 shows a comparison of the simulated loop inductance for a group of three capacitors using separate pads (old design) and the pad line structure (new design) with 18 mils via diameter and for different via lengths. Depending of the via length the total loop inductance can by reduced by a factor of 5.3 for a via with a length of 500 μm and by a factor of 2.7 for via with a length of 2.5 mm.

Due to the reduction of the pad-via loop inductance the effectiveness of the capacitor is increased and the total number of capacitors needed for decoupling purposes on cards and boards can be reduced. In Table 1 a comparison of the numbers of capacitors, needed for decoupling of the 1.5 V and of the 1.8 V on a board, is shown as an example. The calculations were performed using the old pad via design and the new pad via design. The number of capacitors used for 1.5 V and 1.8 V decoupling can be reduced from 4792 to 1985 and from 373 to 155.

TABLE 1

|  | Old Design | New Design |
| --- | --- | --- |
| Capacitor # on 1.5 V | 4792 | 1985 |
| Capacitor # on 1.8 V | 373 | 155 |
| Capacitor # total | 5165 | 2140 |

The advantages of these reductions are:
decreasing prices for assembled components due to decreasing component number
reduce manufacturing cost due to reduced production cycle time (reduced component placement time and reduced drilling time for vias)
reduce wireability problems due to reduced capacitor number and via number
reduce component placement problems on dense assembled cards and boards
reduce component distances due to lower number of capacitors
reduce signal delay, reduce cycle time, increase system performance
improve card/board cross section due to lower via number
reduce parallel resonances between different types of capacitors due to lower parasitic inductance of the vias Another main advantage of the new pad via design is the improved wireability in the capacitor area. Each via is fabricated with clearence holes on each power layer (for a via connected to ground) and on each ground layer (for a via connected to power). Due to different reasons (e.g. coupling, impedance mismatch) signal wires are in general not allowed to cross a clearance hole. Thus the clearance hole reduces the wireability in the capacitor area. In contrast to the old capacitor pad-via design where the clearance holes of a via pair (power and ground via of one capacitor) are separated, the via holes of the new capacitor pad-via design are overlapping due to the small distance between the via pair. Due to the overlap of the via holes the wiring area is increased. Thus the wireability in the capacitor area is increased, the number of wire layers can be reduced in a dense wiring area and at last the card and board costs can be reduced.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. Method for minimizing switching noise in the high- and mid-frequency range on printed circuit cards or boards by means of a plurality of surface mounted decoupling capacitors, said capacitors each comprising a pair of opposing pads having opposing padlines, each of said pads being connected to power/ground planes by respective vias, said method comprising:
arranging said pairs of capacitor pads by connecting pads to form enlarged pads resulting in enlarged opposing padlines and at the same time minimizing the distance between opposite pads, and arranging said respective vias at the smallest possible distance with respect to each other and with respect to respective decoupling capacitors.

2. Method according to claim 1, wherein said respective vias are arranged at only one side of the decoupling capacitor power/ground planes.

3. Method according to claim 1, wherein said respective vias are arranged on both sides of the decoupling capacitor power/ground planes.

4. A structure including:
a printed circuit card or board; and
a plurality of decoupling capacitors mounted on the surface of said card or board, each of said capacitors comprising a pair of opposing pads having opposing padlines, said pads being connected to power/ground planes by respective vias, wherein said pairs of capacitor pads are arranged to form enlarged opposing pads resulting in enlarged opposing padlines, and at the same time are arranged to minimize the distance between each enlarged pad, and that said respective vias are arranged at the smallest possible distance with respect to each other and with respect to respective decoupling capacitors.

5. Structure according to claim 4 wherein said respective vias are arranged at only one side of the decoupling capacitor power/ground planes.

6. Structure according to claim 4 wherein said respective vias are arranged on both sides of the decoupling capacitor power/ground planes.

7. Method for minimizing switching noise in the high- and mid-frequency range on printed circuit cards or boards by means of a plurality of surface mounted decoupling capacitors arranged in a row, said capacitors each comprising a pair of opposing pads having opposing padlines, each pad of said opposing pads of each capacitor being configured to mount a portion of said respective capacitor, each pad of said pair of opposing pads being arranged in a same row as a pad of an adjacent pair of opposing pads configured to mount the same portion of an adjacent capacitor, each of said pads being connected to power/ground planes by respective vias, said method comprising:
arranging said pairs of capacitor pads by connecting adjacent pads in the same row such that an enlarged pad is formed and the padlines of the pads in the same row are aligned and at the same time minimizing the distance between opposing aligned padlines, and arranging said respective vias at the smallest possible distance with respect to each other and with respect to respective decoupling capacitors.

8. The method of claim 7 further comprising arranging the respective vias between adjacent capacitors.

9. The method of claim 8, wherein the respective vias are arranged in the same row as said capacitors.

10. A structure including:
a printed circuit card or board; and
a plurality of decoupling capacitors mounted on the surface of said card or board in a row, each of said capacitors comprising a pair of opposing pads being configured to mount a portion of said respective capacitor, each pad of said pair of opposing pads having a padline facing the padline of the opposing pad of said pair of opposing pads, said pads being connected to power/ground planes by respective vias, each pad of said pair of opposing pads being arranged in a same row as a pad of an adjacent pair of opposing pads configured to mount the same portion of an adjacent capacitor such that an enlarged pad is formed and the padlines of the pads in the same row are aligned, and at the same time are arranged to minimize the distance between opposing aligned padlines, and that said respective vias are arranged at the smallest possible distance with respect to each other and with respect to respective decoupling capacitors.

11. Structure according to claim 10, wherein said vias are interposed between adjacent capacitors.

12. Structure according to claim 11, wherein said vias are arranged in the same row as said capacitors.

13. Structure according to claim 10, wherein said respective vias and adjacent capacitors are arranged alternatingly on said enlarged pads.

14. Structure according to claim 10, wherein said respective vias are arranged at only one side of the decoupling capacitor.

15. Structure of claim 14, wherein said vias are arranged at only one side of the decoupling capacitor.

16. Structure of claim 14, wherein said vias are arranged closer to the padlines than the sides of said pads opposite the padlines.

17. Structure according to claim 10, wherein said respective vias are arranged on both sides of the decoupling capacitor.

18. A structure including:

a printed circuit card or board; and a decoupling capacitor mounted on the surface of said card or board, said capacitor comprising a pair of opposing pads being configured to mount a portion of said capacitor, each pad of said pair of opposing pads having a padline facing the padline of the opposing pad of said pair of opposing pads, said pads being connected to power/ground planes by vias, said opposing pads are arranged to minimize the distance between opposing padlines, and that said vias are arranged at the smallest possible distance with respect to each other and with respect to said decoupling capacitor.

* * * * *